United States Patent
Peeters Weem et al.

(10) Patent No.: US 9,909,907 B2
(45) Date of Patent: Mar. 6, 2018

(54) DOUBLE QUADRATURE WITH ADAPTIVE PHASE SHIFT FOR IMPROVED PHASE REFERENCE PERFORMANCE

(71) Applicant: Tektronix, Inc., Beaverton, OR (US)

(72) Inventors: Jan P. Peeters Weem, Forest Grove, OR (US); Klaus M. Engenhardt, Tübingen (DE); Laszlo J. Dobos, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 533 days.

(21) Appl. No.: 14/519,370

(22) Filed: Oct. 21, 2014

(65) Prior Publication Data
US 2016/0033309 A1   Feb. 4, 2016

Related U.S. Application Data

(60) Provisional application No. 62/030,214, filed on Jul. 29, 2014.

(51) Int. Cl.
*G01D 18/00* (2006.01)
*G01R 13/02* (2006.01)
*G01R 31/317* (2006.01)

(52) U.S. Cl.
CPC ......... *G01D 18/00* (2013.01); *G01R 13/0272* (2013.01); *G01R 31/31709* (2013.01)

(58) Field of Classification Search
CPC .............. G01D 18/00; G01R 31/31709; G01R 13/0272

See application file for complete search history.

(56) References Cited

U.S. PATENT DOCUMENTS

| 6,384,657 B1 | 5/2002 | Laszlo |
| 6,573,761 B1 | 6/2003 | MacDonald |
| 2003/0081667 A1* | 5/2003 | Camnitz ................. H04L 1/205 375/226 |

OTHER PUBLICATIONS

Stevens et al., Numerically Controlled 8-Channel IQ-Transmitter with Programmable Synchronous Carrier Settings, Nov. 27-28, 2008, SAFE 2008/ProRISC 2008, Veldhoven, The Netherlands, 6 pp.*
Mak Pui-In et al., "Two-Step Channel Selection Technique by Programmable Didital-Double Quadrature Sampling for Complex Low-IF Receivers", Electronics Letters, IEE Stevenage, vol. 39, No. 11, May 29, 2003, pp. 825-827.
European Search Report and Written Opinion for Application No. 15178826.2 dated Feb. 5, 2016, 8 pages.

* cited by examiner

*Primary Examiner* — Toan Le
(74) *Attorney, Agent, or Firm* — Marger Johnson; Kevin Dothager

(57) ABSTRACT

A method for correcting a timing error in a test and measurement instrument. The method includes receiving a clock signal at each of four samplers. The first clock signal is sampled at the first sampler at a first phase, the second clock signal is sampled at the second sampler at a second phase that is 90 degrees offset from the first phase, the third clock signal is sampled at the third sampler at a third phase that is 45 degrees offset from the first phase, and the fourth clock signal is sampled at the fourth sampler at a fourth phase that is 90 degrees offset from the third phase. Each of the outputs from the samplers are digitized and a timing correction is calculated based on the digitized outputs from the digitized outputs.

8 Claims, 3 Drawing Sheets

DOUBLE QUADRATURE WITH ADAPTIVE PHASE SHIFT FOR IMPROVED PHASE REFERENCE PERFORMANCE

CROSS-REFERENCE TO RELATED APPLICATIONS

This application claims the benefit of U.S. Provisional Patent Application No. 62/030,214 titled "DOUBLE QUADRATURE WITH ADAPTIVE PHASE SHIFT FOR IMPROVED PHASE REFERENCE PERFORMANCE" filed on Jul. 29, 2014.

TECHNICAL FIELD

This disclosure relates to an equivalent time system in a sampling test and measurement instrument to reduce the amount of jitter in a test and measurement instrument. Specifically, the disclosure relates to calculating a timing correction via a clock signal to reduce the amount of jitter in a test and measurement instrument.

BACKGROUND

In an equivalent time sampling oscilloscope, a phase reference module is used to compensate for jitter in the time base of the oscilloscope. Two signals are measured—a data signal and a clock signal. The clock signal is a sinusoid or a similar sine-like signal that is aligned to the data signal. The data signal, on the other hand, can be almost any other type of signal. Traditionally, timing errors are calculated by the system shown in FIG. 1. The timing correction is made to the data signal by measuring the phase of the clock signal and using the clock signal phase measurement to adjust the timing of the data signal based on the calculated error.

FIG. 1 depicts a traditional timing correction system traditionally used in time sampling oscilloscopes. A clock signal 102 synchronized to the data is input into the system 100 through the clock signal input 100. The clock signal 102 is split into two clock signals 104 and 106 via a splitter 120.

Each clock signal 104 and 106 is sent to a respective sampler 108 and 110. Samplers 108 and 110 sample the clock signal at different phases that are ideally 90 degrees apart. That is, the samplers 108 and 110 are strobed by a strobe 122 at 90 degrees offset from each other. The samplers are set to strobe at times that are separated by 90 degrees so that the in-phase and quadrature components of the clock signal can be measured. When the phase between the two samples taken by the samplers 108 and 110 are exactly 90 degrees apart, the error made in estimating the phase of the clock signal is a function of only the amplitude noise of the clock and noise present in the samplers 108 and 110.

The output signals from the samplers 108 and 110 are each input into respective analog-to-digital converters (ADC) 112 and 114. The digitized signals are then sent to the phase measurement unit 116 so the phases of the digitized signals can be calculated. Once the phases have been calculated, a timing correction can be calculated in a processor 118. The in-phase and quadrature components of the digitized signal are used to estimate the phase of the clock, and from the phase of the clock the timing error of the sampling test and measurement instrument can be estimated.

Because the actual difference between the two samples is not exactly 90 degrees, the jitter measured by the scope becomes a function of the phase of the signal. This leads to non-repeatable results where different values or jitter are measured depending on the phase difference between the clock and a measured data signal by the oscilloscope. This causes different parts of the measured data signal to have potentially different amounts of jitter depending on the phase of the clock at the point of the measurement. This is non-ideal and can lead to user confusion.

SUMMARY

Certain embodiments of the disclosed technology include a method for correcting a timing error in a test and measurement instrument. The method includes receiving a clock signal that is split into a first clock signal, a second clock signal, a third clock signal and a fourth clock signal. The first clock signal is routed to a first sampler, the second clock signal is routed to a second sampler, the third clock signal is routed to a third sampler; and the fourth clock signal is routed to the fourth sampler. The first clock signal is sampled at the first sampler at a first phase, the second clock signal is sampled at the second sampler at a second phase that is 90 degrees offset from the first phase, the third clock signal is sampled at the third sampler at a third phase that is 45 degrees offset from the first phase, and the fourth clock signal is sampled at the fourth sampler at a fourth phase that is 90 degrees offset from the third phase. Each of the outputs from the samplers are digitized and a timing correction is calculated based on the digitized outputs from the digitized outputs.

Certain embodiments of the disclosed technology include a timing error correction system for use in a test and measurement instrument. The timing error correction system includes a clock input, a splitter configured to split the clock signal into four clock signals; four samplers, each sampler configured to receive one of the four clock signals and configured to output a sampled signal, at least two analog-to-digital converters configured to receive the output sampled signals from the four samplers, and a processor configured to calculate a timing correction error based on the digitized outputs of the four samplers.

DETAILED DESCRIPTION

Figure 1:
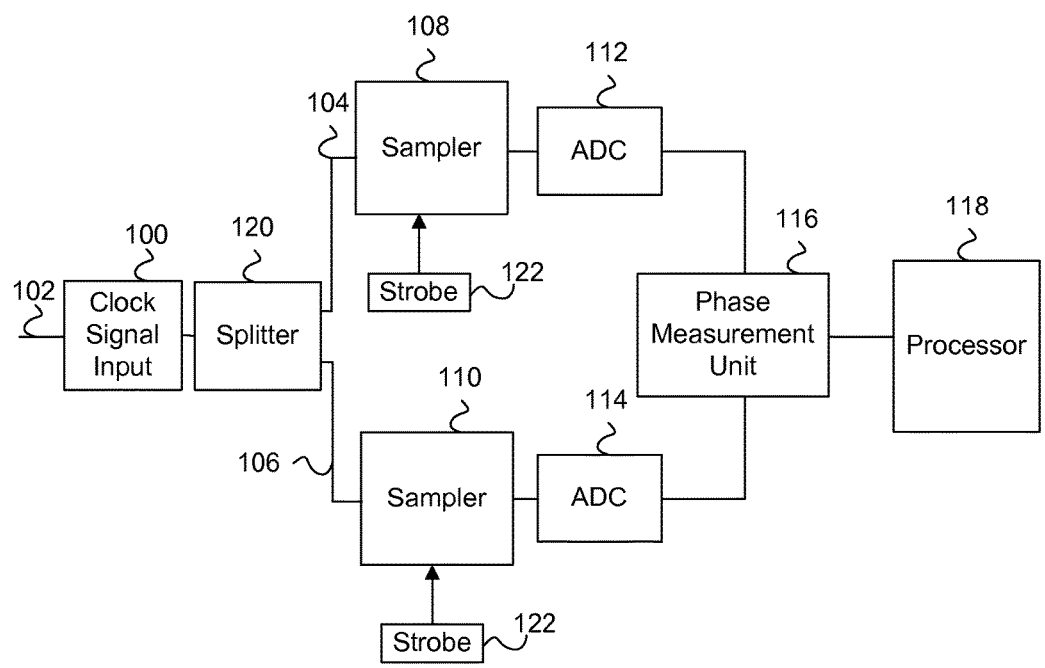
FIG. 1 illustrates a block diagram of a traditional timing correction system used in a sampling test and measurement instrument.

In the drawings, which are not necessarily to scale, like or corresponding elements of the disclosed systems and methods are denoted by the same reference numerals.

The disclosed technology reduces the amount of jitter in an equivalent time sampling test and measurement instrument. The equivalent time system reduces jitter by accurately measuring and then correcting the timing errors of a sampling test and measurement instrument. The disclosed technology reduces the amount of error in the time estimation and thereby reduces the total jitter present in a measurement of a data signal, as discussed in more detail below.

Figure 2:
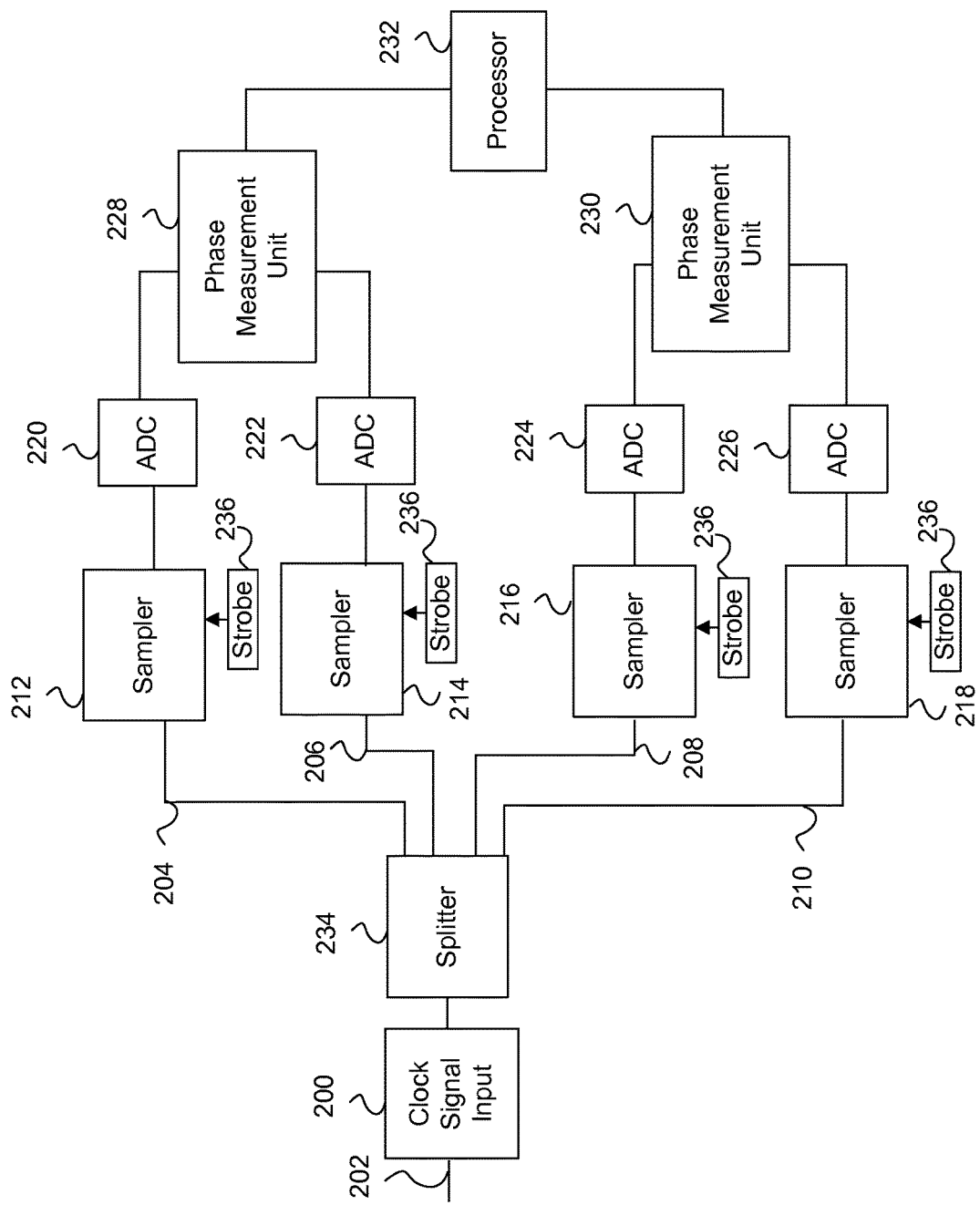
FIGS. 2 and 3 illustrate block diagrams of embodiments of a timing correction system used in a sampling test and measurement instrument according to the disclosed technology.

FIG. 2 depicts some embodiments of the equivalent time system of the disclosed technology. The system includes an input 200 for a clock signal 202. The clock signal 202 is a sinusoid or similar sine like signal that is aligned to a data signal. The clock signal 202 is split into four clock signals 204, 206, 208 and 210. The clock signal may be split by using a splitter 234. Each of the clock signals 204, 206, 208, and 210 are received at a respective sampler 212, 214, 216, and 218.

The first set of samplers 212 and 214 are strobed by a strobe 236 to be out of phase by 90 degrees, similar to samplers 108 and 110 in FIG. 1 discussed above. The phase delay is added not by delaying the incoming clock signal, but by adjusting the timing of the strobe. The phase delay is added by adjusting the timing of the strobe, rather than delaying the incoming clock signal. The strobe adjusts when the signal is measured. Because the timing of the strobe is not exact, a small amount of uncertainty is present in the timing of the strobe. The uncertainty causes a divergence from the ideal 90 degrees that is required for the optimal quadrature measurement.

Therefore, the second set of samplers 216 and 218 are also strobed by a strobe 236 to be out of phase by 90 degrees with each other. However, the second set of samplers 216 and 218 are strobed with a delay that is offset from the first set of samplers 212 and 214, so that a different portion of the clock signal can be measured. Therefore, sampler 216 is offset from sampler 212 by 45 degrees and sampler 218 is offset from sampler 214 by 45 degrees. Therefore each of the samplers are set to strobe at times separated by 45 degrees. This allows for greater accuracy in determining the timing error by measuring the signal at more phases. By adding the two additional samplers 216 and 218 that have an additional phase adjustment delay with reference to the first set of samplers 212 and 214, the total jitter as well as the variability can be reduced.

The outputs from each of the samplers 212, 214, 216, and 218 are digitized through respective analog-to-digital converters (ADC) 220, 222, 224, and 226. The digitized outputs from the first set of samplers 212 and 214 are inputted to a phase measurement unit 228 and the digitized outputs from the second set of samplers 216 and 218 are inputted to a phase measurement unit 230. The phase measurement units 228 and 230 may be, for example, processors. The phase measurement units 228 and 230 determine the phase difference between samplers 212 and 214, and 216 and 218, respectively. The phase differences are sent to processor 232 and processor 232 determines the average of the phase differences and calculates a timing correction based on the average. Alternatively, the phase measurement units 228 and 230 may be part of the processor 232. Or, phase measurement units 228 and 230 can be located in a single processor separate from processor 232.

Once the timing correction has been determined, the test and measurement instrument uses this correction to correct the timing of the measured data signal. This allows the measured data signal to be placed in the proper order of acquisition.

The advantage of the system shown in FIG. 2 is that when the delay is 45 degrees between each of the samplers, the jitter dependence on the phase of the clock is entirely removed. This eliminates the variation and reduces the total jitter by approximately 40%. Although the above system is preferred as it is the most accurate, it requires two additional analog-to-digital converters within the test and measurement instrument.

Figure 3:
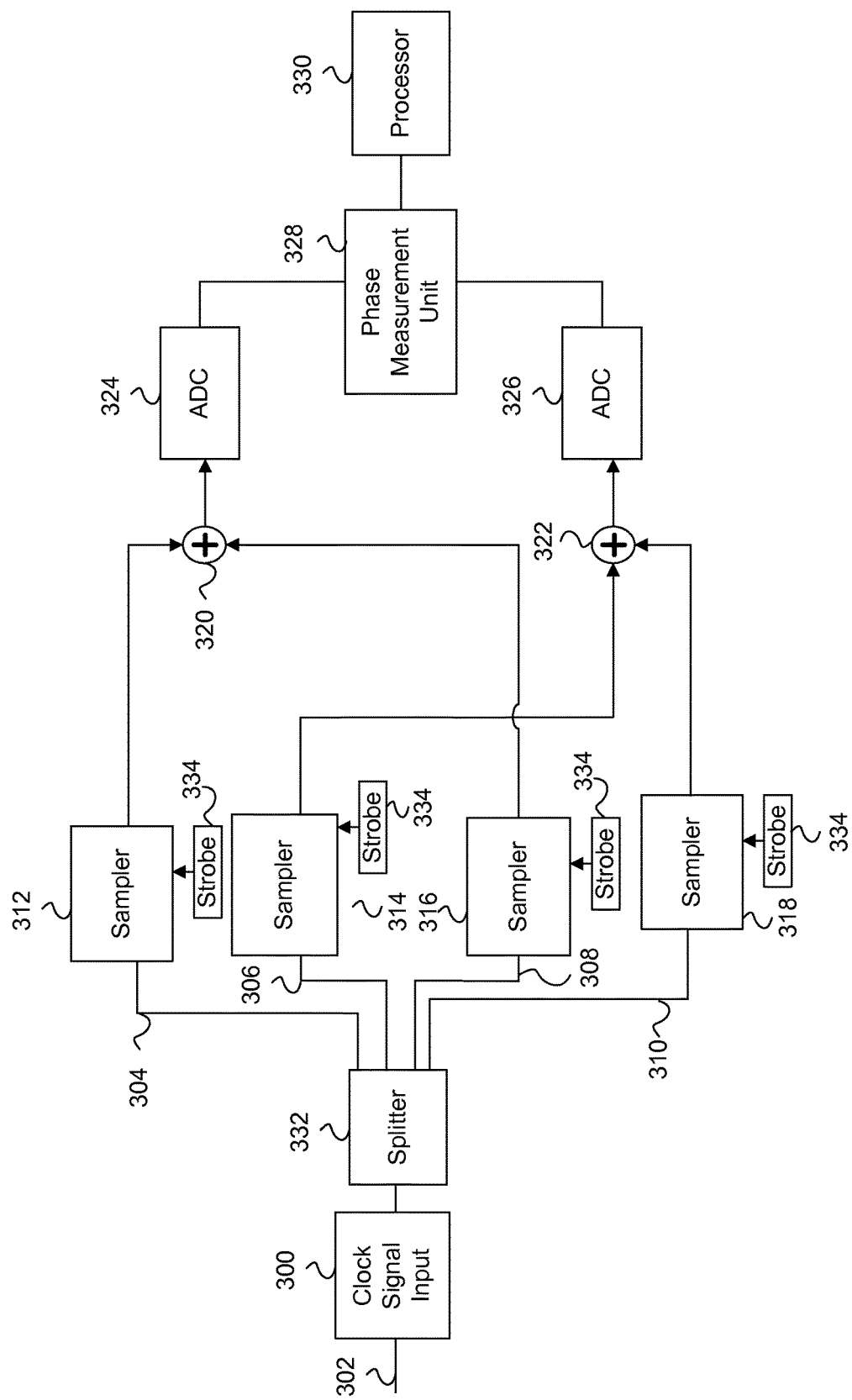

It may be preferable to use two ADCs to avoid the need for additional analog to digital converters (ADCs). FIG. 3 depicts an alternative embodiment of the disclosed technology using only two ADCs.

As seen in FIG. 3, this system also includes an input 300 for a clock signal 302. The clock signal 302 is also split into four clock signals 304, 306, 308 and 310 using a splitter 332. Each clock signal 304, 306, 308, and 310 is received by a respective sampler 312, 314, 316, and 318, as discussed above with respect to FIG. 2. Same as with the embodiment discussed with respect to FIG. 2, each of the samplers are strobed to be out of phase by 45 degrees by a strobe 334.

However, rather than the outputs of the samplers 321, 314, 316, and 318 being input into ADCs, as discussed above with respect to FIG. 2, the analog output from sampler 312 and the analog output from sampler 316 are summed together by a summer 320, and the analog output from sampler 314 and the analog output from sampler 318 are summed together by a summer 322.

Each of the outputs from the summers 320 and 322 are then digitally converted by ADCs 324 and 326, respectively. The output from the ADCs 324 and 326 are input to the phase measurement unit 328. The phase measurement unit 328 determines the phase difference between the output of the summer 320 and the output of the summer 322. Then, a timing correction can be calculated via processor 330. Again, the phase measurement unit 328 may be located within the processor 330.

As mentioned above, the timing error correction system includes a processor and a memory (not shown) to store executable instructions for implementing the above discussed processors of the test and measurement instrument. Computer readable code embodied on a computer readable medium, when executed, causes the computer to perform any of the above-described operations. As used here, a computer is any device that can execute code. Microprocessors, programmable logic devices, multiprocessor systems, digital signal processors, personal computers, or the like are all examples of such a computer. In some embodiments, the computer readable medium can be a tangible computer readable medium that is configured to store the computer readable code in a non-transitory manner.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:

1. A method of correcting a timing error in a test and measurement instrument, comprising:
   receiving a clock signal and a data signal, wherein the clock signal is synchronized with the data signal;
   splitting the clock signal into a first clock signal, a second clock signal, a third clock signal, and a fourth clock signal;
   routing the first clock signal to a first sampler, the second clock signal to a second sampler, the third clock signal to a third sampler; and the fourth clock signal to a fourth sampler;
   sampling the first clock signal by the first sampler at a first phase to produce a first sampled signal;
   sampling the second clock signal by the second sampler at a second phase that is 90 degrees offset from the first phase to produce a second sampled signal;
   sampling the third clock signal by the third sampler at a third phase that is 45 degrees offset from the first phase to produce a third sampled signal;
   sampling the fourth clock signal by the fourth sampler at a fourth phase that is 90 degrees offset from the third phase to produce a fourth sampled signal;

producing two or more digitized signals based on the first sampled signal, the second sampled signal, the third sampled signal, and the fourth sampled signal;

determining one or more phase differences from the two or more digitized signals;

calculating a timing correction based on the one or more phase differences; and modifying timing of the data signal using the calculated timing correction to correct the timing error in the test and measurement instrument.

2. The method of claim 1, wherein producing two or more digital signals further comprises:

summing the first sampled signal and the third sampled signal;

producing a first digitized signal, of the two or more digitized signals, from a result of the summing of the first sampled signal and the third sampled signal;

summing the second sampled signal and the fourth sampled signal; and producing a second digitized signal, of the two or more digitized signals, from a result of the summing of the second sampled signal and the fourth sampled signal, wherein determining the one or more phase differences is to determine a phase difference between the first digitized signal and the second digitized signal.

3. The method of claim 1, wherein producing two or more digitized signals based on the first samples, the second samples, the third samples, and the fourth samples includes:

producing a first digitized signal from the first sampled signal;

producing a second digitized signal from the second sampled signal;

producing a third digitized signal from the third sampled signal;

producing a fourth digitized signal from the fourth sampled signal;

wherein determining one or more phase differences from the two or more digitized signals includes:

calculating a first phase difference between the first digitized signal and the second digitized signal calculating a second phase difference between the third digitized signal and the fourth digitized signal; and wherein determining one or more phase differences from the digitized signals includes averaging the first phase difference and the second phase difference.

4. The method of claim 1, wherein the sampling of the first clock signal is performed by the first sampler in accordance with a first strobe, the sampling of the second clock signal is performed by the second sampler in accordance with a second strobe, the sampling of the third clock signal is performed by the third sampler in accordance with a third strobe, and the sampling of the fourth clock signal is performed by the fourth sampler in accordance with a fourth strobe.

5. A timing error correction system for use in a test and measurement instrument, comprising:

a clock signal input configured to receive a clock signal;

a data signal input configured to receive a data signal;

a splitter configured to split the clock signal into a first clock signal, a second clock signal, a third clock signal, and a fourth clock signal;

a first sampler configured to sample the first clock signal at a first phase to produce a first sampled signal;

a second sampler configured to sample the second clock signal at a second phase that is offset 90 degrees from the first phase to produce a second sampled signal;

a third sampler configured to sample the third clock signal at a third phase that is offset 45 degrees from the first phase to produce a third sampled signal;

a fourth sampler configured to sample the fourth clock signal at a fourth phase that is offset 90 degrees from the third phase to produce a fourth sampled signal;

at least two analog-to-digital converters configured to produce two or more digitized signals based on the first sampled signal, the second sampled signal, the third sampled signal, and the fourth sampled signal at least one phase measurement unit configured to determine a phase difference between the two or more digitized signals; and a processor configured to calculate a timing correction based on the phase difference and modify timing of the data signal using the calculated timing correction to correct a timing error in the test and measurement instrument.

6. The timing error correction system of claim 5, further comprising:

a first strobe coupled with the first sampler wherein the first strobe is configured to cause the first sampler to sample the first clock signal at the first phase;

a second strobe coupled with the second sampler wherein the second strobe is configured to cause the second sampler to sample the second clock signal at the second phase;

a third strobe coupled with the third sampler wherein the third strobe is configured to cause the third sampler to sample the third clock signal at the third phase;

a fourth strobe coupled with the fourth sampler wherein the fourth strobe is configured to cause the fourth sampler to sample the fourth clock signal at the fourth phase.

7. The timing error correction system of claim 5, wherein the at least two analog-to-digital converters include:

a first analog-to-digital converter configured to produce a first digitized signal from the first sampled signal;

a second analog-to-digital converter configured to produce a second digitized signal from the second sampled signal;

a third analog-to-digital converter configured to produce a third digitized signal from the third sampled signal;

a fourth analog-to-digital converter configured to produce a fourth digitized signal from the fourth sampled signal; and wherein the processor is configured to calculate the timing correction through calculation of a first phase measurement between the first digitized signal and the second digitized signal, calculation of a second phase measurement between the third digitized signal and the fourth digitized signal, and determination of the average of the first phase measurement and the second phase measurement.

8. The timing error correction system of claim 5, further comprising:

a first summer configured to sum the first sampled signal and the third sampled signal to produce a first summed signal;

a second summer configured to sum the second sampled signal and the fourth sampled signal to produce a second summed signal, wherein the two or more digitized signals include: a first digitized signal based on the first summed signal and a second digitized signal based on the second summed signal.

\* \* \* \* \*